United States Patent
Derat

(10) Patent No.: US 10,944,491 B2
(45) Date of Patent: Mar. 9, 2021

(54) METHOD AND SYSTEM FOR POSITIONING A DEVICE UNDER TEST WITHIN A TEST AREA

(71) Applicant: Rohde & Schwarz GmbH & Co. KG, Munich (DE)

(72) Inventor: Benoit Derat, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 31 days.

(21) Appl. No.: 16/239,071

(22) Filed: Jan. 3, 2019

(65) Prior Publication Data

US 2020/0220632 A1 Jul. 9, 2020

(51) Int. Cl.
| | |
|---|---|
| *H04B 17/391* | (2015.01) |
| *G01R 29/08* | (2006.01) |
| *H04B 17/12* | (2015.01) |
| *G06T 19/00* | (2011.01) |
| *H04B 17/27* | (2015.01) |

(52) U.S. Cl.
CPC ......... *H04B 17/3912* (2015.01); *G01R 29/08* (2013.01); *G06T 19/006* (2013.01); *H04B 17/12* (2015.01); *H04B 17/27* (2015.01); *G06T 2219/2004* (2013.01)

(58) Field of Classification Search
CPC .... H04B 17/3912; H04B 17/27; H04B 17/12; G01R 29/08; G01R 31/2837; G06T 19/006; G06T 2219/2004
See application file for complete search history.

(56) References Cited

U.S. PATENT DOCUMENTS

| | | | | |
|---|---|---|---|---|
| 2014/0122049 | A1* | 5/2014 | Kyosti | H04B 17/391 703/13 |
| 2017/0147622 | A1* | 5/2017 | Sterzbach | G06K 9/00718 |
| 2018/0053310 | A1* | 2/2018 | Liu | G06T 7/292 |
| 2018/0269996 | A1* | 9/2018 | Rowell | H04B 17/0085 |
| 2018/0313890 | A1* | 11/2018 | Wolff | G01R 31/2868 |
| 2018/0376272 | A1* | 12/2018 | Setiawan | G10L 19/008 |
| 2019/0191268 | A1* | 6/2019 | Rowell | H04W 4/80 |
| 2020/0066404 | A1* | 2/2020 | Peters | G16H 20/30 |

FOREIGN PATENT DOCUMENTS

| | | |
|---|---|---|
| JP | 2004233249 A | 8/2004 |
| WO | 2017117519 A1 | 7/2017 |

OTHER PUBLICATIONS

SGPP TS 34.114 V 10.1.1 (2011-2012), 3rd Generation Partnership Project; Technical Specification Group Radio Access Network; User Equipment (UE)/Mobile Station (MS) Over the Air (OTA) antenna performance; Conformance Testing (Release 10), 78 pages.

* cited by examiner

*Primary Examiner* — Lester G Kincaid
*Assistant Examiner* — Maryam Soltanzadeh
(74) *Attorney, Agent, or Firm* — Ditthavong & Steiner, P. C.

(57) ABSTRACT

A method for positioning a device under test within a test area is provided. The method comprises the steps of determining shape and/or quality of a quiet zone with respect to the device under test, and using an augmented reality technique in order to optimize the positioning of the device under test in the quiet zone.

18 Claims, 2 Drawing Sheets

METHOD AND SYSTEM FOR POSITIONING A DEVICE UNDER TEST WITHIN A TEST AREA

TECHNICAL FIELD

The invention relates to a method and system for positioning a device under test within a test area, wherein augmented reality techniques are especially employed.

BACKGROUND ART

Generally, in times of an increasing number of applications providing wireless communication capabilities, there is a growing need of a method and a system for positioning a device under test comprising such an application within a test area especially in order to verify correct functioning of said applications in a highly accurate and efficient manner.

JP 2004-233249 A relates to a biaxially positioner for electromagnetic radiation patterns of a wireless device that radiates electromagnetic waves in all directions. More particularly, it relates to biaxially positioner which can be used in an anechoic box or anechoic chamber. As it can be seen, due to the fact that said positioner does not take account of positioning a device under test within a test area with special respect to any quiet zone, the usage of said biaxially positioner disadvantageously leads to a limited accuracy, and thus also to a reduced efficiency.

Accordingly, there is a need to provide a method and a system for positioning a device under test within a test area, each of which ensures both a high accuracy and an increased efficiency.

SUMMARY OF THE INVENTION

According to a first aspect of the invention, a method for positioning a device under test within a test area is provided. The method comprises the steps of determining shape and/or quality of a quiet zone with respect to the device under test, and using an augmented reality technique in order to optimize the positioning of the device under test in the quiet zone. Advantageously, both accuracy and efficiency can be increased especially by accurately positioning the device under test within the quiet zone. Further advantageously, this allows to limit the error on the measurement results even in compact test environments and gives capability to fully identify the exact position of the device under test preferably in a three-dimensional manner, thereby especially giving possibility to increase repeatability.

According to a first preferred implementation form of the first aspect of the invention, the test area comprises a quiet zone in an anechoic chamber, preferably in an anechoic chamber with compact antenna test range, or a quiet zone of an outdoor test field. Advantageously, especially in the case of an anechoic chamber, accuracy can further be increased.

According to a second preferred implementation form of the first aspect of the invention, the quiet zone comprises plane waves. Advantageously, the occurrence of errors can further be reduced.

According to a further preferred implementation form of the first aspect of the invention, the quiet zone is of two-dimensional or three-dimensional shape. Advantageously, measurements can be performed in a flexible manner, thereby increasing efficiency.

According to a further preferred implementation form of the first aspect of the invention, the method further comprises the step of finding an ideal position of the device under test on the basis of the shape of the quiet zone and the shape of the device under test, preferably on the basis of the shape of the quiet zone and a location of at least one antenna within the device under test. Advantageously, accuracy can further be increased.

According to a further preferred implementation form of the first aspect of the invention, the quiet zone is located inside an anechoic chamber, wherein the method further comprises the step of measuring the quality of the quiet zone from amplitude ripple caused by reflections inside the anechoic chamber. Advantageously, for instance, accuracy can further be increased.

According to a further preferred implementation form of the first aspect of the invention, the method further comprises the step of creating a model, preferably a three-dimensional model, of the device under test in order to supplement the augmented reality technique when positioning the device under test in the quiet zone. Advantageously, this allows for increasing accuracy.

According to a further preferred implementation form of the first aspect of the invention, the method further comprises the step of using at least one camera for creating the model, preferably the three-dimensional model, of the device under test. Advantageously, for instance, both accuracy and efficiency can further be increased.

According to a further preferred implementation form of the first aspect of the invention, the quiet zone is located inside an anechoic chamber, and wherein the at least one camera is located inside or outside the anechoic chamber. Advantageously, for example, efficiency can further be increased.

According to a further preferred implementation form of the first aspect of the invention, the method further comprises the step of observing the device under test under various angles to reconstruct the model, preferably the three-dimensional model, of the device under test. Advantageously, for instance, this allows for increasing accuracy.

According to a further preferred implementation form of the first aspect of the invention, the method further comprises the step of recording magnitude and/or phase in the quiet zone preferably from previous measurements. Advantageously, in this manner, accuracy can further be increased.

According to a further preferred implementation form of the first aspect of the invention, the method further comprises the step of visualizing the position of the device under test within a three-dimensional representation of the magnitude and/or phase distribution of the electromagnetic field within the quiet zone.

Advantageously, not only accuracy but also efficiency can further be increased.

According to a further preferred implementation form of the first aspect of the invention, the method further comprises the step of using lasers and/or targets in order to build reference points. Advantageously, for example, an increased accuracy can be ensured.

According to a further preferred implementation form of the first aspect of the invention, the quiet zone is located inside an anechoic chamber, wherein the method further comprises the step of aligning quiet zone data with coordinate system within the anechoic chamber. Advantageously, both accuracy and efficiency can further be increased.

According to a further preferred implementation form of the first aspect of the invention, the quiet zone is located inside an anechoic chamber, wherein the method further comprises the step of aligning quiet zone data with coordinate system within the anechoic chamber on the basis of the reference points. Advantageously, not only accuracy but also efficiency can further be increased.

According to a second aspect of the invention, a system for positioning a device under test within a test area is provided. The system comprises a measurement equipment, and a positioner. In this context, the measurement equipment is configured to determine shape and/or quality of a quiet zone with respect to the device under test. In addition to this, the positioner is configured to position the device under test in the quiet zone on the basis of an augmented reality technique. Advantageously, both accuracy and efficiency can be increased especially by accurately positioning the device under test within the quiet zone. Further advantageously, this allows to limit the error on the measurement results even in compact test environments and gives capability to fully identify the exact position of the device under test preferably in a three-dimensional manner, thereby especially giving possibility to increase repeatability.

According to a first preferred implementation form of the second aspect of the invention, the test area comprises a quiet zone in an anechoic chamber, preferably in an anechoic chamber with compact antenna test range, or a quiet zone of an outdoor test field. Advantageously, especially in the case of an anechoic chamber, accuracy can further be increased.

According to a second preferred implementation form of the second aspect of the invention, the quiet zone comprises plane waves. Advantageously, the occurrence of errors can further be reduced.

According to a further preferred implementation form of the second aspect of the invention, the quiet zone is of two-dimensional or three-dimensional shape. Advantageously, measurements can be performed in a flexible manner, thereby increasing efficiency.

According to a further preferred implementation form of the second aspect of the invention, the measurement equipment is further configured to create a model, preferably a three-dimensional model, of the device under test in order to supplement the augmented reality technique when positioning the device under test in the quiet zone. Advantageously, this allows for increasing accuracy.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
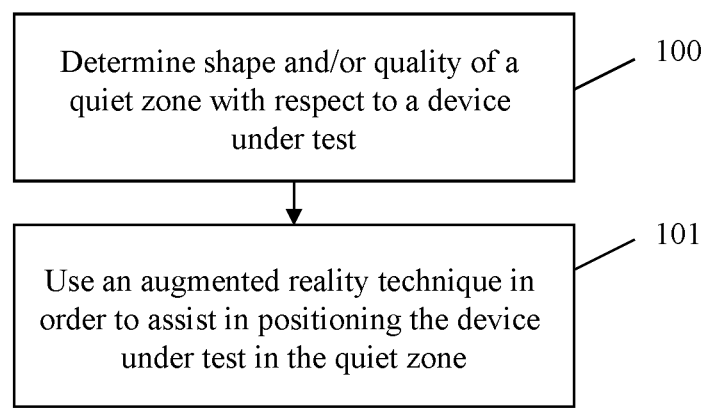
FIG. 1 shows a flow chart of an exemplary embodiment of the first aspect of the invention.

Firstly, FIG. 1 shows a flow chart of an exemplary embodiment of the inventive method for positioning a device under test within a test area. In a first step 100, shape and/or quality of a quiet zone with respect to the device under test are determined. Then, in a second step 101, an augmented reality technique is used in order to assist in positioning the device under test in the quiet zone.

In this context, the test area may comprise a quiet zone in an anechoic chamber. Advantageously, the test area may comprise a quiet zone in an anechoic chamber with compact antenna test range (CATR). Alternatively, the test area may comprise a quiet zone of an outdoor test field. Advantageously, the test area may comprise a quiet zone of a large outdoor test field.

It is further noted that it might be particularly advantageous if the quiet zone comprises plane waves. With respect to the quiet zone with plane waves, the plane waves preferably fulfill at least one certain criterion within the quiet zone. In other words, the center of the quiet zone may especially have the best plane waves, whereas when going further outside, the respective wave are less plane.

Additionally, with respect to the above-mentioned shape determination regarding the quiet zone, said shape determination may preferably be carried out with the aid of at least one measurement antenna. Further additionally, said shape determination may preferably carried out once before the measurement.

Furthermore, the quiet zone may preferably be of two-dimensional or three-dimensional shape.

Moreover, the method may further comprise the step of finding an ideal position of the device under test on the basis of the shape of the quiet zone and the shape of the device under test, preferably on the basis of the shape of the quiet zone and a location of at least one antenna within the device under test.

It might be particularly advantageous if the quiet zone is located inside an anechoic chamber, wherein the method further comprises the step of measuring the quality of the quiet zone from amplitude ripple caused by reflections inside the anechoic chamber.

It is further noted that the method may comprise the step of creating a model, preferably a three-dimensional model, of the device under test in order to supplement the augmented reality technique when positioning the device under test in the quiet zone.

Furthermore, the method may further comprise the step of using at least one camera for creating the model, preferably the three-dimensional model, of the device under test.

Moreover, it is noted that the quiet zone may be located inside an anechoic chamber. In addition to this, the at least one camera may be located inside or outside the anechoic chamber.

It might be particularly advantageous if the method further comprises the step of observing the device under test under various angles to reconstruct the model, preferably the three-dimensional model, of the device under test.

It should further be mentioned that the method may comprise the step of recording magnitude and/or phase in the quiet zone preferably from previous measurements.

Additionally, the method may further comprise the step of visualizing the position of the device under test within a three-dimensional representation of the magnitude and/or phase distribution of the electromagnetic field within the quiet zone.

Furthermore, the method may further comprise the step of using lasers and/or targets in order to build reference points.

Moreover, as already mentioned above, the quiet zone may be located inside an anechoic chamber. In addition to this, the method may further comprise the step of aligning quiet zone data with coordinate system within the anechoic chamber.

As an alternative, also in the case that the quiet zone is located inside an anechoic chamber, the method may comprise the step of aligning quiet zone data with coordinate system within the anechoic chamber on the basis of the above-mentioned reference points.

Figure 2:
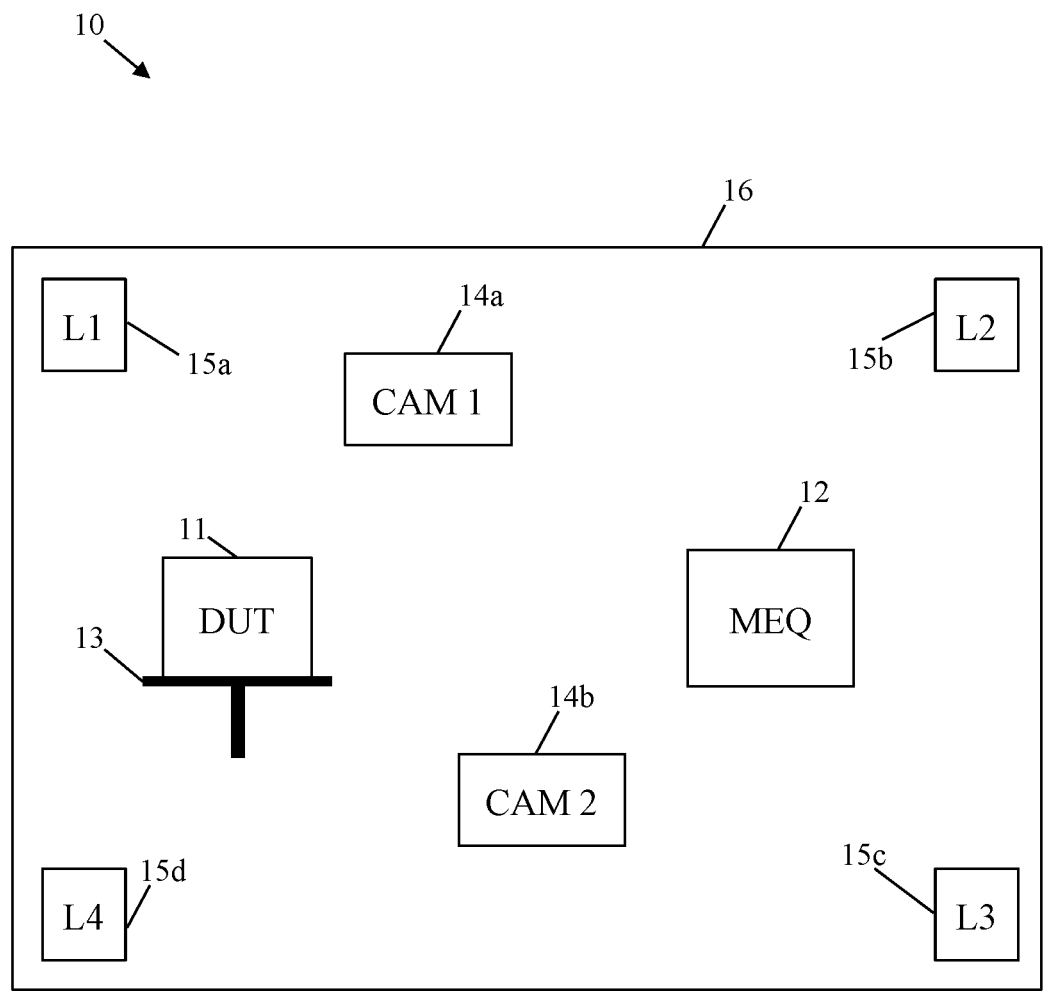
FIG. 2 shows an exemplary embodiment of the second aspect of the invention.

Finally, FIG. 2 illustrates an exemplary embodiment of the inventive system 10 for positioning a device under test 11 within a test area. Said system 10 comprises a measurement equipment 12, and a positioner 13.

In this context, the measurement equipment 12 determines shape and/or quality of a quiet zone with respect to the device under test 11. In addition to this, the positioner 13 positions the device under test 11 in the quiet zone on the basis of an augmented reality technique.

In addition to this, the test area comprises a quiet zone in an anechoic chamber 16. Said anechoic chamber 16 may preferably be an anechoic chamber with compact antenna test range. As an alternative, the test area may comprise a quiet zone of an outdoor test field.

Further additionally, said quiet zone comprises plane waves. With respect to the quiet zone with plane waves, the plane waves preferably fulfill at least one certain criterion within the quiet zone. In other words, the center of the quiet zone may especially have the best plane waves, whereas when going further outside, the respective wave are less plane.

Moreover, it is noted that the quiet zone may especially be of two-dimensional or three-dimensional shape.

It might be particularly advantageous if the positioner 13 finds an ideal position of the device under test 11 on the basis of the shape of the quiet zone and the shape of the device under test 11, preferably on the basis of the shape of the quiet zone and a location of at least one antenna within the device under test 11.

In this context, it is noted that the device under test 11 especially provides wireless connection capabilities. In addition to this, the device under test 11 especially comprises at least one antenna.

It is further noted that the quiet zone is exemplarily located inside the anechoic chamber 16. It might be particularly advantageous if wherein the measurement equipment 12 measures the quality of the quiet zone from amplitude ripple caused by reflections inside the anechoic chamber 16.

Furthermore, the measurement equipment 12 may especially create a model, preferably a three-dimensional model, of the device under test 11 in order to supplement the augmented reality technique when positioning the device under test 11 in the quiet zone.

In this context, the measurement equipment 12 may especially use at least one camera for creating the model, preferably the three-dimensional model, of the device under test 11. Exemplarily, the two cameras 14a, 14b are used.

In addition to this, as it can be seen from FIG. 2, the two cameras 14a, 14b are exemplarily located inside the anechoic chamber 16. In general, at least one camera may be located inside or outside the anechoic chamber 16.

Further additionally, with the aid of the above-mentioned two cameras 14a, 14b, the device under test 11 is observed under various angles to reconstruct the model, preferably the three-dimensional model, of the device under test 11.

It might be particularly advantageous if the measurement equipment 12 records magnitude and/or phase in the quiet zone preferably from previous measurements.

Moreover, it is noted that the measurement equipment 12 may visualize the position of the device under test 11 within a three-dimensional representation of the magnitude and/or phase distribution of the electromagnetic field within the quiet zone.

As it can further be seen from FIG. 2, four lasers 15a, 15b, 15c, 15d are exemplarily used In general, lasers and/or targets are especially used in order to build reference points.

Furthermore, it is noted that the measurement equipment 12 may preferably align quiet zone data with coordinate system within the anechoic chamber 16.

As an alternative, the measurement equipment 12 may preferably align quiet zone data with coordinate system within the anechoic chamber 16 on the basis of the above-mentioned reference points.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for positioning a device under test within a test area, the method comprising the steps of:
   determining shape and/or quality of a quiet zone with respect to the device under test,
   optimizing the positioning of the device under test in the quiet zone with an augmented reality technique,
   creating a three-dimensional model of the device under test in order to supplement the augmented reality technique when positioning the device under test in the quiet zone, and
   visualizing the position of the device under test within a three-dimensional representation of the magnitude or phase distribution of the electromagnetic field within the quiet zone.

2. The method according to claim 1,
   wherein the test area comprises a quiet zone in an anechoic chamber with compact antenna test range or a quiet zone of an outdoor test field.

3. The method according to claim 1,
   wherein the quiet zone comprises plane waves.

4. The method according to claim 1,
   wherein the quiet zone is of two-dimensional or three-dimensional shape.

5. The method according to claim 1,
   wherein the method further comprises the step of finding an ideal position of the device under test on the basis of the shape of the quiet zone and the shape of the device under test and a location of at least one antenna within the device under test.

6. The method according to claim 1,
   wherein the quiet zone is located inside an anechoic chamber, wherein the method further comprises the step of measuring the quality of the quiet zone from amplitude ripple caused by reflections inside the anechoic chamber.

7. The method according to claim 1, wherein the method further comprises the step of using at least one camera for creating the three-dimensional model of the device under test.

8. The method according to claim 7, wherein the quiet zone is located inside an anechoic chamber, and wherein the at least one camera is located inside or outside the anechoic chamber.

9. The method according to claim 1, wherein the method further comprises the step of observing the device under test under various angles to reconstruct the three-dimensional model, of the device under test.

10. The method according to claim 1, wherein the method further comprises the step of recording magnitude and/or phase in the quiet zone from previous measurements.

11. The method according to claim 1, wherein the method further comprises the step of using lasers and/or targets in order to build reference points.

12. The method according to claim 1, wherein the quiet zone is located inside an anechoic chamber, wherein the method further comprises the step of aligning quiet zone data with coordinate system within the anechoic chamber.

13. The method according to claim 11, wherein the quiet zone is located inside an anechoic chamber, wherein the method further comprises the step of aligning quiet zone data with coordinate system within the anechoic chamber on the basis of the reference points.

14. A system for positioning a device under test within a test area, the system comprising:
a measurement equipment, and
a positioner,
wherein the measurement equipment is configured to determine shape and/or quality of a quiet zone with respect to the device under test,
wherein the measurement equipment is configured to create a three-dimensional model of the device under test in order to supplement an augmented reality technique when positioning the device under test in the quiet zone,
wherein the measurement equipment is further configured to visualize the position of the device under test within a three-dimensional representation of the magnitude or phase distribution of the electromagnetic field within the quiet zone, and
wherein the positioner is configured to position the device under test in the quiet zone on the basis of an augmented reality technique.

15. The system according to claim 14, wherein the test area comprises a quiet zone in an anechoic chamber with compact antenna test range or a quiet zone of an outdoor test field.

16. The system according to claim 14, wherein the quiet zone comprises plane waves.

17. The system according to claim 14, wherein the quiet zone is of two-dimensional or three-dimensional shape.

18. The system according to claim 14, wherein the measurement equipment is further configured to create a three-dimensional model of the device under test in order to supplement the augmented reality technique when positioning the device under test in the quiet zone.

* * * * *